(12) United States Patent
Sheikh-Movahhed et al.

(10) Patent No.: US 6,178,315 B1
(45) Date of Patent: Jan. 23, 2001

(54) FM RADIO RECEIVER

(75) Inventors: Mohammad-Reza Sheikh-Movahhed, Ann Arbor, MI (US); Yukio Suzuki, Koganei (JP)

(73) Assignee: Visteon Global Technologies, Inc., Dearborn, MI (US)

(*) Notice: Under 35 U.S.C. 154(b), the term of this patent shall be extended for 0 days.

(21) Appl. No.: 09/195,525

(22) Filed: Nov. 19, 1998

(51) Int. Cl.[7] .................................................. H04B 1/18
(52) U.S. Cl. .................................. 455/193.1; 455/197.1; 455/182.2; 455/286; 455/154
(58) Field of Search .................................. 455/193.1, 193.2, 455/193.3, 196.1, 197.2, 205, 197.1, 286, 154, 182.2; 325/315, 316

(56) References Cited

U.S. PATENT DOCUMENTS

| | | |
|---|---|---|
| 3,828,257 | 8/1974 | Puskas . |
| 4,237,556 | * 12/1980 | Naito ..................... 455/154 |
| 4,271,529 | 6/1981 | Strammello, Jr. . |
| 4,334,323 | 6/1982 | Moore . |
| 4,361,909 | * 11/1982 | Theriault ................ 455/286 |
| 4,703,292 | 10/1987 | Okanobu . |
| 5,263,183 | * 11/1993 | Owen ..................... 455/193.1 |
| 5,404,587 | * 4/1995 | Okanobu ................ 455/182.2 |
| 5,428,829 | * 6/1995 | Osburn ................... 455/197.1 |
| 5,905,948 | * 5/1999 | Suzuki ................... 455/193.1 |

* cited by examiner

Primary Examiner—Nguyen Vo
Assistant Examiner—John J. Lee
(74) Attorney, Agent, or Firm—Mark L. Mollon (57) ABSTRACT

An FM radio receiver comprises a radio frequency tuning circuit for selecting a frequency modulated signal from an antenna and a local oscillator tuning circuit for tuning to an oscillating signal so as to convert the frequency modulated signal to an intermediate frequency. In the radio frequency tuning circuit, a capacitance variable ratio is set so as to be capable of receiving continuously the frequencies of both a first FM receiving band used in Japan and a second FM receiving band used in the US and Europe. The local oscillator tuning circuit is so constructed that an inductance value and a capacitance variable ratio can be switched so that the receiver is set to lower heterodyne for reception in Japan or upper heterodyne for reception in the US or Europe. As a result, a single receiver design can be configured for reception of FM radio broadcasting in either Japan or the US or Europe using a common front-end circuit, without increasing the number of components.

18 Claims, 6 Drawing Sheets

FM RADIO RECEIVER

BACKGROUND OF THE INVENTION

This invention relates to an FM radio receiver containing a radio frequency tuning circuit for selecting a signal from an antenna and a local oscillator tuning circuit tunable to an oscillating signal for converting the frequency of a receiving signal to an intermediate frequency.

In such a kind of super-heterodyne FM radio receiver, a desired broadcast signal received at an antenna is converted to a frequency called an intermediate frequency (IF), which is then detected and demodulated. For FM reception, 10.7 MHz is normally used as this intermediate frequency. A local oscillator circuit is oscillated at a frequency always apart from the frequency of a desired signal (that is, receiving frequency) by 10.7 MHz. A 10.7 MHz IF signal is generated as a beat component as a result of mixing the oscillating signal of this local oscillator circuit and the received signal so as to convert the received signal to the intermediate frequency. At this conversion, if the local oscillator circuit is oscillated at a frequency higher by 10.7 MHz than the receiving frequency, it is called the upper heterodyne method. On the other hand, if the local oscillator circuit is oscillated at a frequency lower by 10.7 MHz than the receiving frequency, it is called the lower heterodyne method.

Whether an FM radio receiver is designed in the upper heterodyne method or lower heterodyne method is determined depending on the frequency allocation for FM radio broadcasting in each country and the presence of interference signals at image frequencies. In a super-heterodyne FM radio receiver, if an interference signal is located at the image frequency which is 10.7 MHz apart from a local oscillating frequency in the opposite direction to a receiving frequency, (i.e., 21.4 MHz apart from the receiving frequency,) image signals are mixed into the intermediate frequency signal resulting in interference. In Japan, the frequency allocation for FM radio broadcasting is 76–90 MHz, and channel 2 of TV broadcasting is allocated at frequencies 21.4 MHz higher than the FM band. In the USA, the frequency allocation for FM radio broadcasting is 88–108 MHz, and channels 4 to 6 of TV broadcasting are allocated at frequencies 21.4 MHz lower than the FM band. Accordingly, to avoid image frequency interference by strong TV broadcasting signals with a high electric field strength, the lower heterodyne method is used in Japan and the upper heterodyne method is used in the US (and also in Europe).

Figure 6:
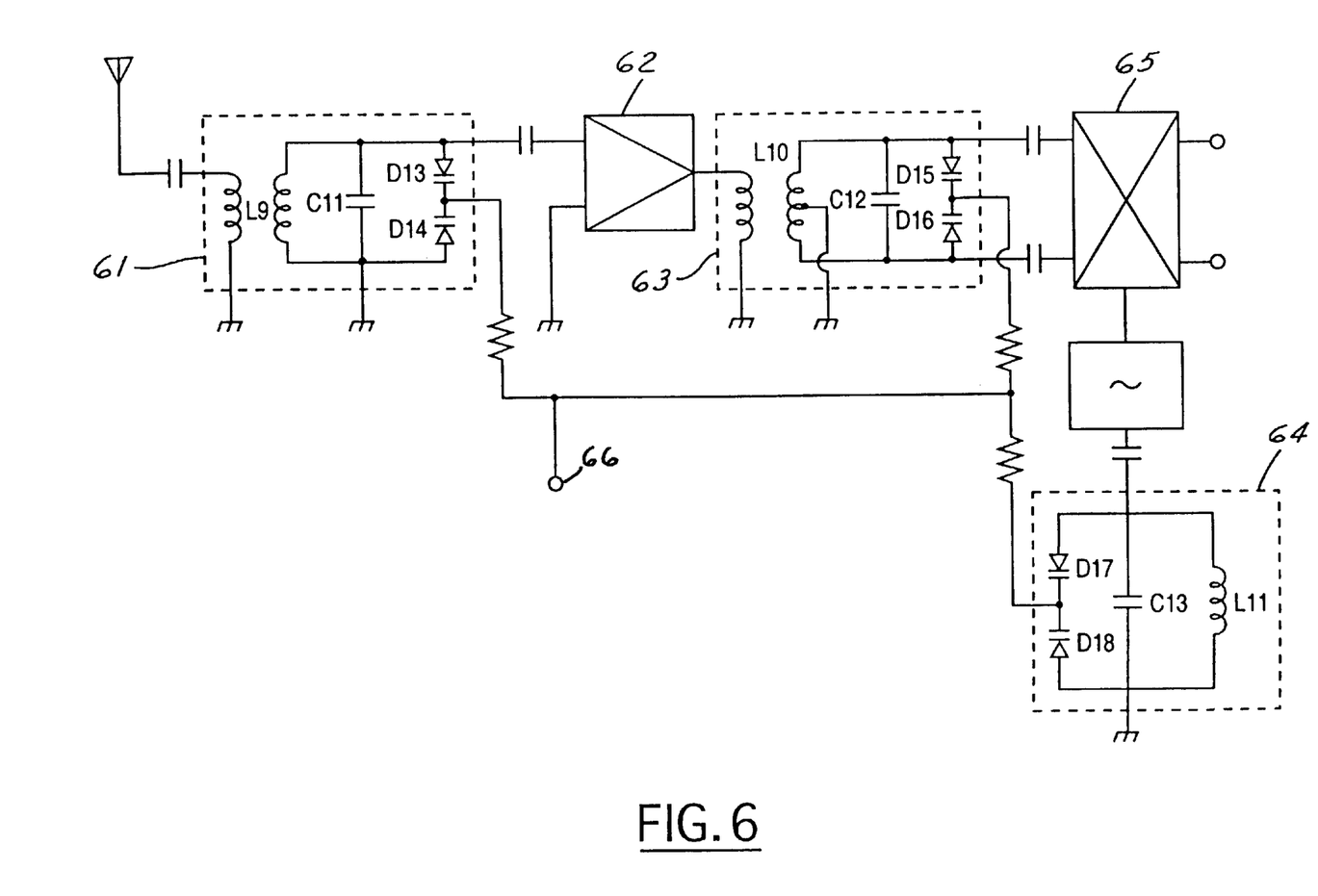
FIG. 6 is a circuit diagram of a front-end circuit of a conventional FM radio receiver.

A conventional FM radio receiver will now be described referring to a car radio receiver with a front-end circuit as shown in FIG. 6.

The front-end circuit of the conventional FM radio receiver comprises a radio frequency tuning circuit containing an antenna tuning circuit 61 and an RF tuning circuit 63, an RF amplifier circuit 62, a local oscillator circuit containing a local oscillator tuning circuit 64, and a mixer circuit 65. The antenna tuning circuit 61 comprises a tuning coil L9, a pair of variable capacitance diodes D13, D14 which cathodes are connected to each other, and a capacitor C11. The RF tuning circuit 63 comprises a tuning coil L10, a pair of variable capacitance diodes D15, D16 which cathodes are connected to each other, and a capacitor C12. The local oscillator tuning circuit 64 comprises an oscillator coil L11, a pair of variable capacitance diodes D17, D18 which cathodes are connected to each other, and a capacitor C13. The variable capacitance diodes D13, D14, D15, D16, D17, D18 have the same voltage versus capacitance characteristic. A common tuning voltage from a source 66 is applied to each pair of the variable capacitance diodes of the antenna tuning circuit 61, RF tuning circuit 63, and local oscillator tuning circuit 64. Generally, this tuning voltage is set in a range of from 1 to 8 volts which can be supplied stably from a vehicle battery.

For an FM radio receiver which is intended for use in Japan, a value of each element is determined so that, within a tuning voltage range (e.g., 1–8 V) applied to the pair of the variable capacitance diodes of each tuning circuit, the antenna tuning circuit 61 and RF tuning circuit 63 tune to FM radio broadcasting signals of 76–90 MHz and the local oscillator tuning circuit 64 tunes to oscillating signals (i.e., 65.3–79.3 MHz) which are lower by 10.7 MHz than the tuning frequencies of the antenna tuning circuit 61 and RF tuning circuit 63.

For an FM radio receiver which is intended for use in the US, a value of each element is determined so that, within a tuning voltage range (e.g., 1–8 V) applied to the pair of the variable capacitance diodes of each tuning circuit, the antenna tuning circuit 61 and RF tuning circuit 63 tune to FM radio broadcasting signals of 88–108 MHz and the local oscillator tuning circuit 64 tunes to oscillating signals (i.e., 98.7–118.7 MHz) which are higher by 10.7 MHz than the tuning frequencies of the antenna tuning circuit 61 and RF tuning circuit 63.

For the FM radio receivers described above, the receiving bands are different between receivers for Japan and the US, and, moreover, the oscillating frequencies of the local oscillator circuits are entirely different because of a difference between upper heterodyne and lower heterodyne methods. Consequently, as shown in Table 1, the values of the coil elements and capacitance elements in the radio frequency tuning circuit and the local oscillator tuning circuit are significantly different for manufacturing the separate receivers. It is noted that, for both cases in Table 1, variable capacitance diodes used in each tuning circuit are those whose capacitance values change from 12 to 22.5 pF when the tuning voltage is changed from 1 to 8 V.

TABLE 1

|  | radio frequency tuning circuit | | local oscillator tuning circuit | |
| --- | --- | --- | --- | --- |
|  | tuning coil L9, L10 | Capacitance element C11, C12 | Oscillator coil L11 | Capacitance element C13 |
| for Japan | 120.476 nH | 14.03 pF | 182.127 nH | 10.117 pF |
| for US | 104.258 nH | 8.77 pF | 76.42 nH | 11.525 pF |

Therefore, conventional FM radio receivers need to be designed and manufactured separately for Japan and the US. Consequently, more design work is involved and the handling of components used in manufacturing the FM radio receivers becomes complicated since more components are required, thereby spoiling productivity.

SUMMARY OF THE INVENTION

An object of the present invention is to provide an FM radio receiver wherein both a circuit necessary for receiving FM radio broadcasting signals in Japan and a circuit necessary for receiving FM radio broadcasting signals in US can be incorporated by means of a common front-end circuit without increasing the number of components, thereby preventing an increase of design work and a decline of productivity.

To achieve the above object, the present invention provides an FM radio receiver comprising a radio frequency tuning circuit for selecting a frequency modulated signal from an antenna and a local oscillator tuning circuit for tuning to an oscillating signal so as to convert the frequency of a receiving signal to an intermediate frequency. The radio frequency tuning circuit and the local oscillator tuning circuit each have variable capacitance diode elements. The variable capacitance diode elements of the radio frequency tuning circuit and variable capacitance diode element of the local oscillator tuning circuit are connected to a tuning control voltage source. The radio frequency tuning circuit has a capacitance variable ratio set so as to be capable of receiving continuously a first receiving band and a second receiving band. The local oscillator tuning circuit is so constructed that its inductance value and capacitance variable ratio can be switched according to the receiving band, so that the local oscillator circuit is set to lower heterodyne when the first receiving band is selected and to upper heterodyne when the second receiving band is selected.

DETAILED DESCRIPTION OF PREFERRED EMBODIMENTS

The embodiments of an FM radio receiver according to the present invention will be described with reference to FIGS. 1–5.

Figure 1:
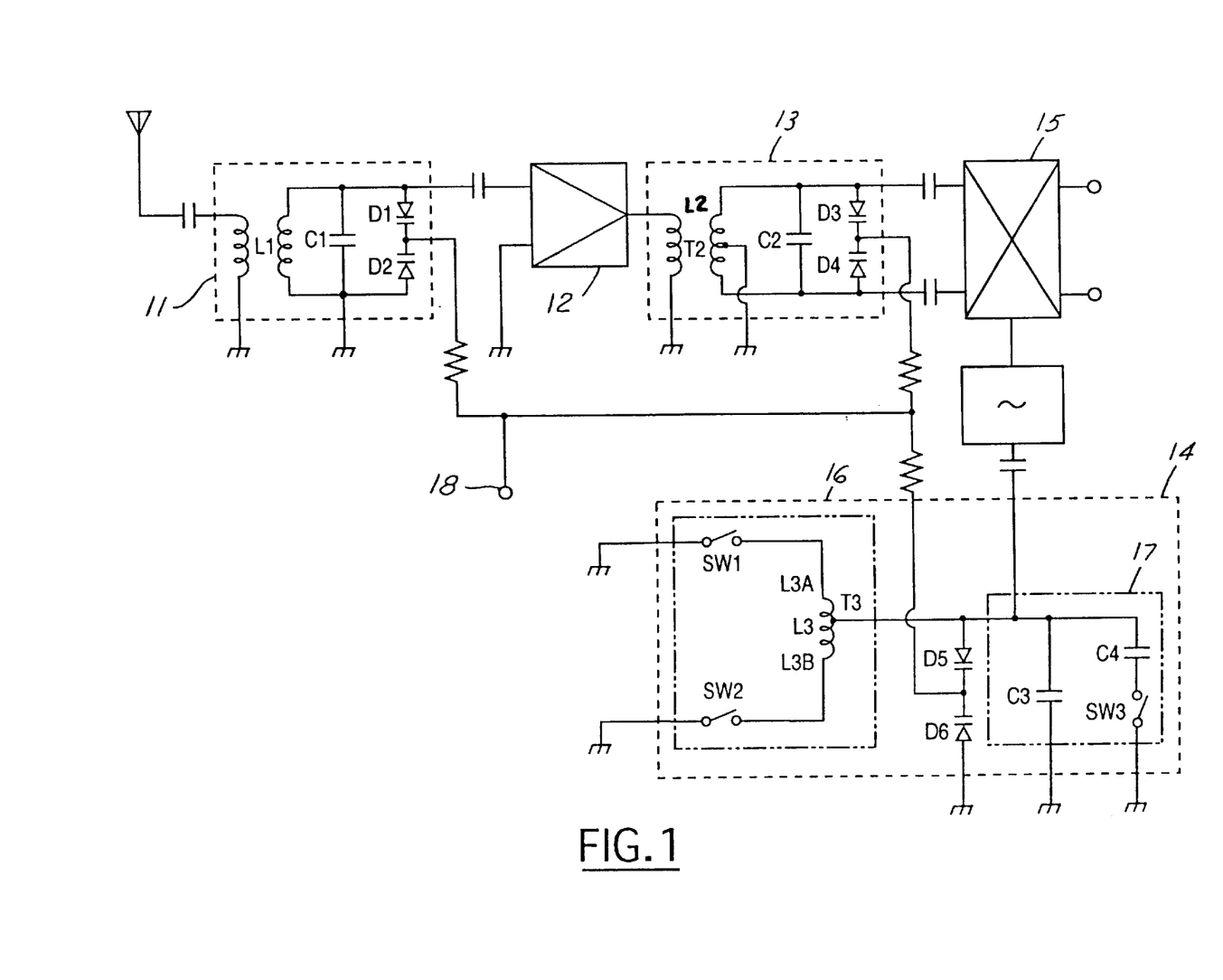
FIG. 1 is a circuit diagram showing a first embodiment of a front-end circuit of the FM radio receiver of the present invention.

FIG. 1 is a circuit diagram showing a first embodiment of a front-end circuit of the FM radio receiver of the present invention. Reference numeral 11 denotes an antenna tuning circuit, numeral 12 denotes an RF amplifier circuit, numeral 13 denotes an RF tuning circuit, numeral 14 denotes a local oscillator tuning circuit and numeral 15 denotes a mixer circuit. The antenna tuning circuit 11 comprises a tuning coil L1, variable capacitance diodes D1, D2 and a capacitor C1. The cathodes of the variable capacitance diodes D1, D2 are connected to each other. The anode of variable capacitance diode D1 is connected to one end of tuning coil L1, and the anode of variable capacitance diode D2 is connected to the other end of tuning coil L1. A capacitor C1 is connected in parallel to tuning coil L1. The RF tuning circuit 13 comprises a tuning coil L2 having a tap T2, variable capacitance diodes D3, D4, and a capacitor C2. The cathodes of variable capacitance diodes D3, D4 are connected to each other. The anode of variable capacitance diode D3 is connected to one end of tuning coil L2 and the anode of variable capacitance diode D4 is connected to the other end of tuning coil L2. A capacitor C2 is connected in parallel to the tuning coil L2. Tap T2 of tuning coil L2 is grounded.

The local oscillator tuning circuit 14 comprises an inductance switching circuit 16 and variable capacitance diodes D5, D6. Circuit 16 includes an oscillator coil L3 with a coil L3A and a coil L3B formed by providing a tap T3. One end of oscillator coil L3 is grounded through a switch SW1 and the other end of oscillator coil L3 is grounded through a switch SW2. The cathodes of variable capacitance diodes D5, D6 are connected to each other. The anode of variable capacitance diode D5 is connected to tap T3 of oscillator coil L3, and the anode of variable capacitance diode D6 is grounded. A switched capacitor circuit 17 for switching a capacitance variable ratio is connected to a junction of variable capacitance diode D5 and tap T3 of oscillator coil L3. The switching circuit 17 is formed by connecting the series circuit of a capacitor C4 and a switch SW3 in parallel with a capacitor C3.

Variable capacitance diodes D1, D2, D3, D4, D5, and D6 have the same voltage versus capacitance characteristic. The cathodes of variable capacitance diodes D1, D2 of the antenna tuning circuit 11, the cathodes of the variable capacitance diodes D3, D4 of the RF tuning circuit 13, and the cathodes of the variable capacity diodes D5, D6 of the local oscillator tuning circuit 14 are connected to a common tuning control voltage source 18.

In this radio frequency tuning circuit, values of circuit elements are determined so as to be capable of covering from 76 MHz which is a lower limit of FM radio broadcasting band in Japan, to 108 MHz which is an upper limit of FM radio broadcasting band in the US. To cover this range, a variable ratio of capacitance necessary for the radio frequency tuning circuit is expressed in equation (1).

$$C\ max/C\ min = (F\ max/F\ min)^2 \qquad (1)$$

where C max is a maximum value of total capacitance of the radio frequency tuning circuit, C min is a minimum value of total capacitance of the radio frequency tuning circuit, F max is a maximum value of tuning frequency and F min is a minimum value of tuning frequency.

If the upper limit (that is, upper limit of US FM radio broadcasting band) of the tuning frequency and the lower limit (that is, lower limit of FM radio broadcasting band of Japan) of the tuning frequency are substituted in the equation (1), the variable ratio of the capacitance of the radio frequency tuning circuit is 2.02. Since this variable ratio of the capacitance of the radio frequency tuning circuit is calculated in terms of the total capacitance including a capacitance of a capacitance element connected to the tuning coil and any stray capacitance, the variable ratio of the variable capacitance diode is required to be larger than this variable ratio of the capacitance of the radio frequency tuning circuit, and is preferred to be more than about 2.5.

On the other hand, the local oscillator tuning circuit 14 is designed so as to be tuned at oscillating frequencies of 65.3–79.3 MHz for use in Japan and 98.7–118.7 MHz for use in the US. Therefore, two kinds of inductance values are switched in the inductance switching circuit 16 so as to be tuned to two discontinuous bands of oscillating signals. Further, in the local oscillator tuning circuit 14, the ratio between the variable ratio of receiving frequency and variable ratio of oscillating frequency for receiver use in Japan is 1.025, while the ratio between the variable ratio of receiving frequency and variable ratio of oscillating frequency for receiver use in the US is 0.980. Therefore, two distinct capacitance values are switched in capacitance ratio switching circuit 17 to achieve that difference.

In this FM radio receiver, if the variable capacitance diodes having a capacitance variable ratio of about 3.0 for the tuning voltage of 1 to 8 V are used as D1, D2, D3, D4, D5, D6, then the preferred value of each circuit element is as shown in Table 2.

TABLE 2

|  | Radio frequency tuning circuit | | Local oscillator tuning circuit | | | |
| --- | --- | --- | --- | --- | --- | --- |
|  | Tuning coil | Capacitance element | Oscillator coil L3 | | Capacitance element | |
|  | L1, L2 | C1, C2 | L3A | L3B | C3 | C4 |
| for Japan | 75 nH | 13 pF |  | 114 nH | 7 pF |  |
| for US | 74 nH | 13 pF | 55 nH |  | 7 pF | 10 pF |

By being designed as above, the values of the tuning coil and capacitance element of the radio frequency tuning circuit can be substantially equal for manufacturing receivers for use in Japan and the US. Therefore, the components to be used for both can be made common.

On the other hand, the values of the oscillator coil and capacitance element of the local oscillator tuning circuit are quite different depending on receiver manufacture for Japan or the US. Therefore, switching of the values is conducted as described below.

For manufacturing the FM radio receiver for the US, in the local oscillator tuning circuit 14, SW1 of inductance switching circuit 16 and SW3 of capacitance ratio switching circuit 17 are set ON and SW2 of inductance switching circuit 16 is set OFF. Thus, local oscillator circuit 14 is tuned to oscillating signals of 98.7–118.7 MHz since coil L3A, variable capacitance diodes D5, D6 and capacitors C3, C4 are active. For manufacturing the FM receiver for use in Japan, in the local oscillator tuning circuit 14, SW1 of inductance switching circuit 16 and SW3 of capacitance ratio switching circuit 17 are set OFF and SW2 of inductance switching circuit 16 is set ON. Thus, local oscillator tuning circuit 14 is tuned to oscillating signals of 65.3–79.3 MHz since coil L3B, variable capacitance diodes D5, D6, and capacitor C3 are active.

Such switching of the inductance and the capacitance variable ratio of the local oscillator tuning circuit is electronically controllable by driving switching elements such as transistors or diodes according to a band switch signal output from a micro-computer, so that selectable manufacturing for shipment to Japan or the US can be made easily in any case.

Figure 2:
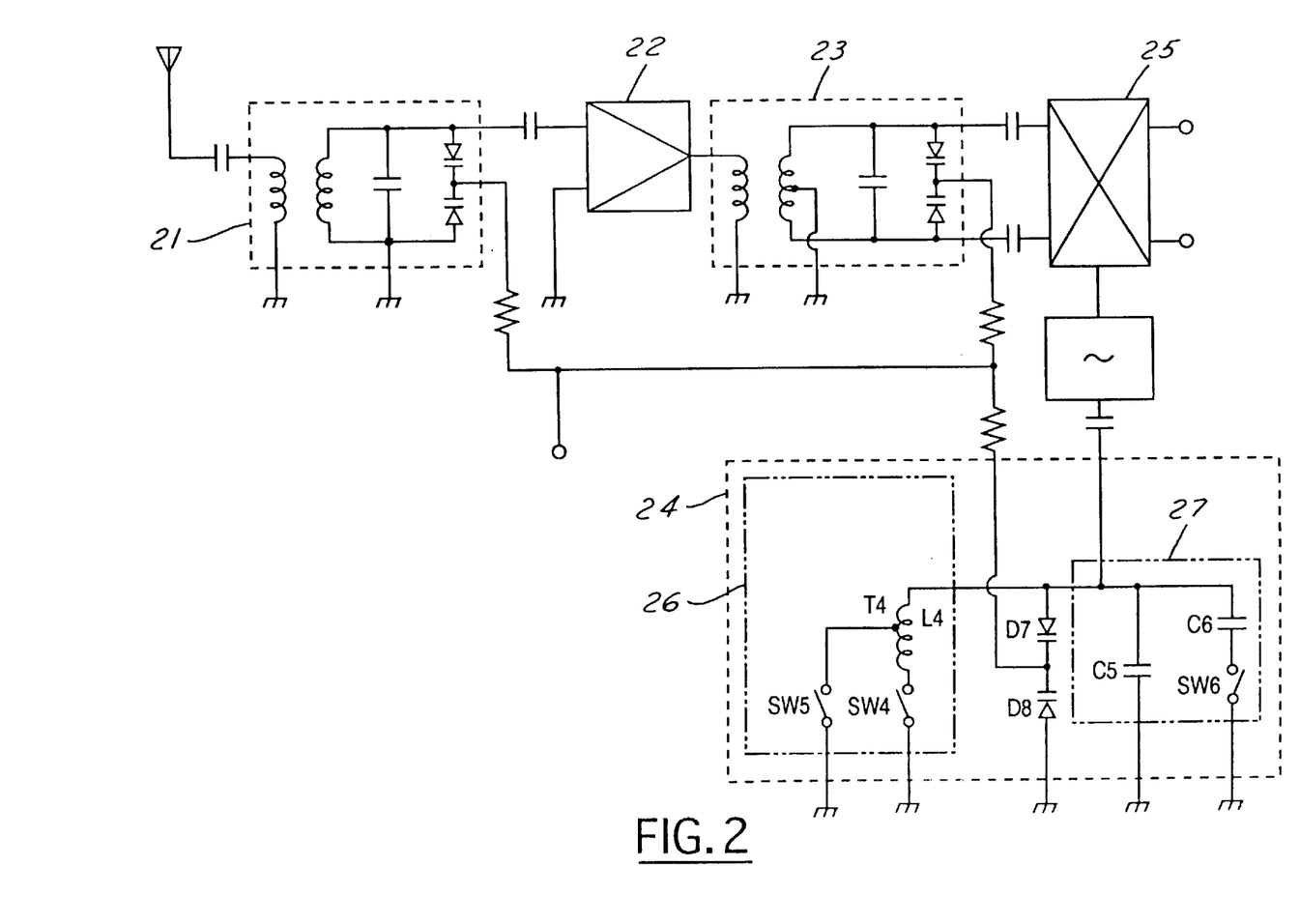
FIG. 2 is a circuit diagram showing a second embodiment of a front-end circuit of the FM radio receiver of the present invention.

FIG. 2 is a circuit diagram showing a second embodiment of a front-end circuit of a FM radio receiver according to the present invention. Reference numeral 21 denotes an antenna tuning circuit, numeral 22 denotes an RF amplifier circuit, numeral 23 denotes an RF tuning circuit, numeral 24 denotes a local oscillator tuning circuit and numeral 25 denotes a mixer circuit.

The antenna tuning circuit 21 and RF tuning circuit 23 each contains a tuning coil, a pair of variable capacitance diodes, and a capacitance element. The values of the circuit elements are determined so as to be capable of covering from the lower limit of 76 MHz of FM radio broadcasting band in Japan to the upper limit of 108 MHz of FM radio broadcasting band in the US.

Local oscillator tuning circuit 24 comprises an oscillator coil L4 having a tap T4 and variable capacitance diodes D7, D8. In oscillator coil L4, one end thereof is grounded through a switch SW4 and tap T4 is also grounded through a switch SW5. Oscillator coil L4 and switches SW4, SW5 form an inductance switching circuit 26. In this inductance switching circuit 26, two inductance values are obtained according to a ratio of a number of windings between the other end of the oscillator coil L4 and tap T4 to a total number of windings of the oscillator coil L4. The cathodes of variable capacitance diodes D7, D8 are connected to each other, an anode of variable capacitance diode D7 is connected to the other end of the oscillation coil L4, and an anode of the variable capacitance diode D8 is grounded. A capacitance ratio switching circuit 27 is connected to a junction of variable capacitance diode D7 and oscillator coil L4. Capacitance ratio switching circuit 27 is formed by connecting a capacitor C5 in parallel to a series circuit of capacitor C6 and switch SW6.

The variable capacitance diodes of the antenna tuning circuit 21, RF tuning circuit 23, and local oscillator tuning circuit 24 have the same voltage versus capacitance characteristic. The cathodes of the variable capacitance diodes of the antenna tuning circuit 21, the cathodes of the variable capacitance diodes of the RF tuning circuit 23, and the cathodes of the variable capacitance diodes of local oscillator tuning circuit 24 are connected to a common tuning power supply.

In case of shipment of the FM radio receiver having such a structure to the US, in local oscillator tuning circuit 24, switch SW5 of inductance switching circuit 26 and switch SW6 of capacitance ratio switching circuit 27 are set ON and switch SW4 of inductance switching circuit 26 is set OFF. Therefore, active components in local oscillator tuning circuit 24 consist of the windings between the other end of oscillator coil L4 and tap T4, variable capacitance diodes D7, D8, and capacitors C5, C6. In case of shipment to Japan, in local oscillator tuning circuit 24, switch SW5 of inductance switching circuit 26 and switch SW6 of capacitance ratio switching circuit 27 are set OFF and switch SW4 of inductance switching circuit 26 is set ON. Therefore, active components in local oscillator tuning circuit 24 consist of oscillator coil L4, variable capacitance diodes D7, D8, and capacitor C5.

Figure 3:
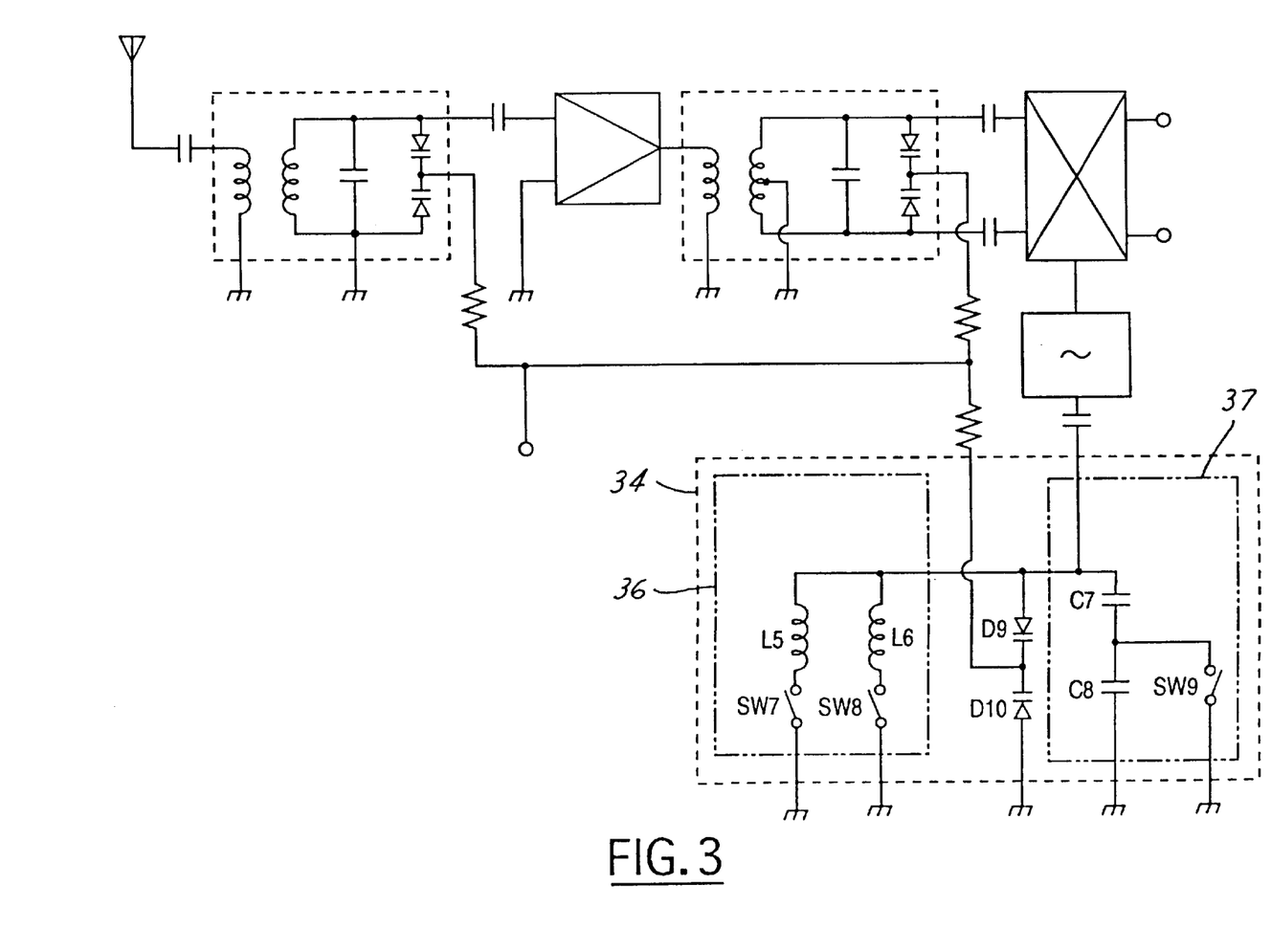
FIG. 3 is a circuit diagram showing a third embodiment of a front-end circuit of the FM radio receiver of the present invention.

FIG. 3 shows a circuit diagram showing a third embodiment of a front-end circuit of the FM radio receiver according to the present invention. In the antenna tuning circuit and RF tuning circuit, the value of each circuit element is determined so as to be capable of receiving frequency modulated signals of 76 MHz–108 MHZ.

A local oscillator tuning circuit 34 comprises oscillator coils L5, L6 and a pair of variable capacitance diodes D9, D10. In an oscillator coil L5, one end thereof is grounded through a switch SW7 and the other end is connected to the one end of an oscillator coil L6. The other end of the oscillator coil L6 is grounded through a switch SW8. An inductance switching circuit 36 is thus comprised of oscillator coils L5, L6 and switches SW7, SW8. An anode of variable capacitance diode D9 is connected to a junction of oscillator coil L5 and oscillator coil L6. An anode of variable capacitance diode D10 is grounded. A capacitance ratio switching circuit 37 is connected to a junction of variable capacitance diode D9 and inductance switching circuit 36. The capacitance ratio switching circuit 37 is formed by connecting a capacitor C7 and capacitor C8 in series while connecting a switch SW9 in parallel to capacitor C8.

The variable capacitance diodes of the antenna tuning circuit, the RF tuning circuit, and local oscillator tuning circuit 34 have the same voltage versus capacitance characteristic and are connected to a common tuning control voltage source.

In case of shipment of the FM radio receiver having such a structure to the US, in local oscillator tuning circuit 34, switch SW7 of inductance switching circuit 36 and switch SW9 of capacitance ratio switching circuit 37 are set ON and switch SW8 of inductance switching circuit 36 is set OFF. In case of shipment to Japan, switch SW7 of inductance switching circuit 36 and switch SW9 of capacitance ratio switching circuit 37 are set OFF and switch SW8 of inductance switching circuit 36 is set ON. Therefore, in case of shipment to US, the active components in local oscillator tuning circuit 34 consist of oscillator coil L5, variable capacitance diodes D9, D10, and capacitor C7. In case of shipment to Japan, the active components in local oscillator tuning circuit 34 consist of oscillator coil L6, variable capacitance diodes D9, D10, and capacitors C7, C8.

It is noted that oscillator coils L5 and L6 may be formed as a single component in which a winding of oscillator coil L5 and a winding of oscillator coil L6 are wound on a common magnetic core. They may also be formed separately.

Figure 4:
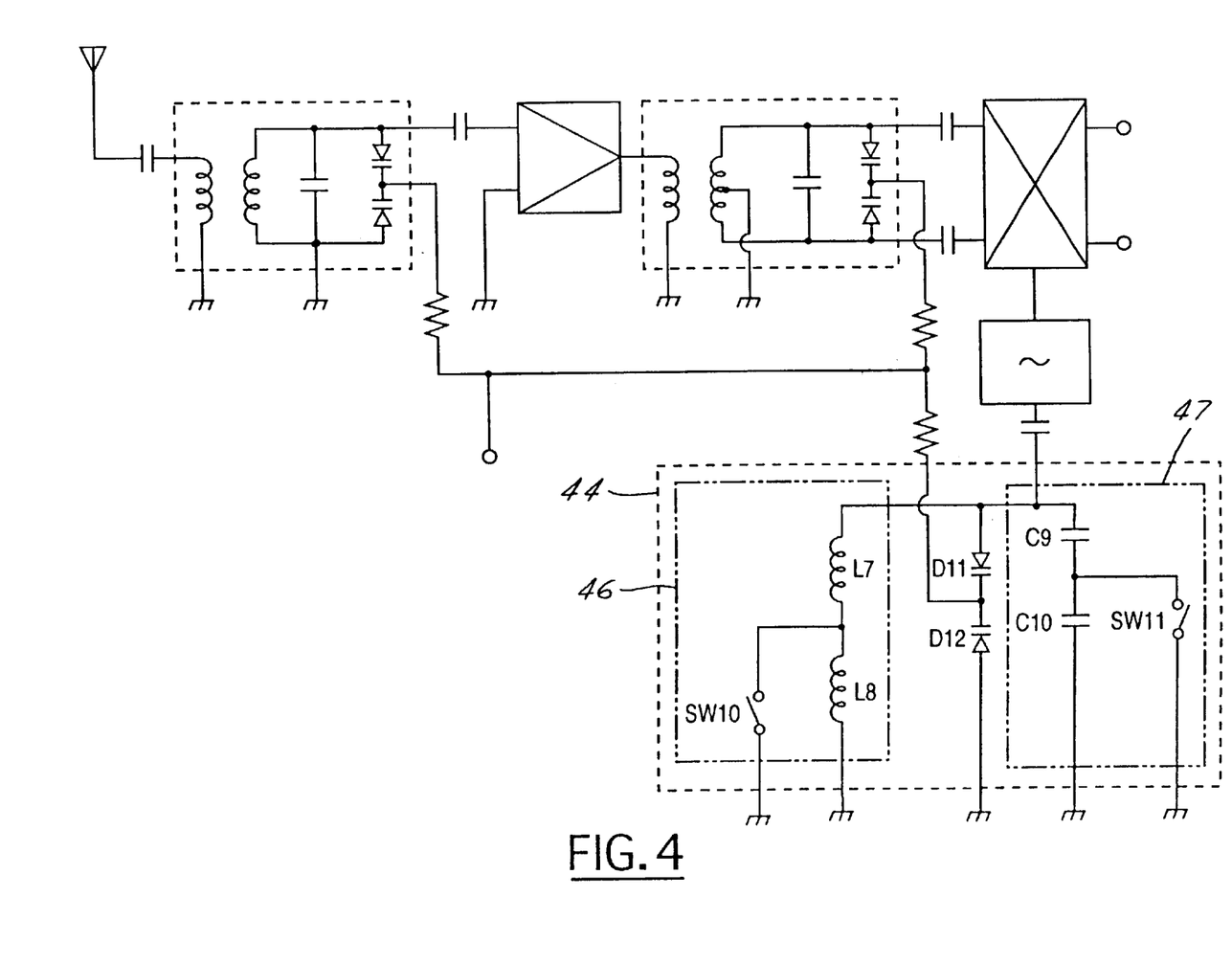
FIG. 4 is a circuit diagram showing a fourth embodiment of a front-end circuit of the FM radio receiver of the present invention.

FIG. 4 is a circuit diagram showing a fourth embodiment of the front-end circuit of the FM radio receiver according to the present invention. The component values of the radio frequency tuning circuit are determined so as to be capable of tuning to frequency modulated signals of 76 MHz–108 MHz.

A local oscillator tuning circuit 44 comprises oscillator coils L7, L8 connected in series and a pair of variable capacitance diodes D11, D12 connected in series.

One end of oscillator coil L8 is grounded and a junction of oscillator coil L7 and oscillator coil L8 is grounded through a switch SW10. An inductance value switching circuit 46 consists of the oscillator coils L7, L8 and switch SW10. Variable capacitance diode D11 is connected to the other end of oscillator coil L7. A capacitance ratio switching circuit 47 is connected to a junction of variable capacitance diode D11 and inductance switching circuit 46. Capacitance ratio switching circuit 47 is formed by connecting capacitors C9 and C10 in series while connecting a switch SW11 in parallel to capacitor C10.

The variable capacitance diodes of the radio frequency tuning circuit and local oscillator tuning circuit 44 have the same voltage versus capacitance characteristic and are connected to a common tuning control voltage source.

Likewise, in case of shipment of the FM radio receiver having such a structure to the US, in the local oscillator tuning circuit 44, switch SW10 of inductance switching circuit 46 and switch SW11 of capacitance ratio switching circuit 47 are set ON. In case of shipment to Japan, switch SW10 of inductance switching circuit 46 and switch SW11 of capacitance ratio switching circuit 47 are set OFF.

In this embodiment, the oscillator coils L7 and L8 are formed separately to avoid magnetic coupling between coils L7 and L8.

Figure 5:
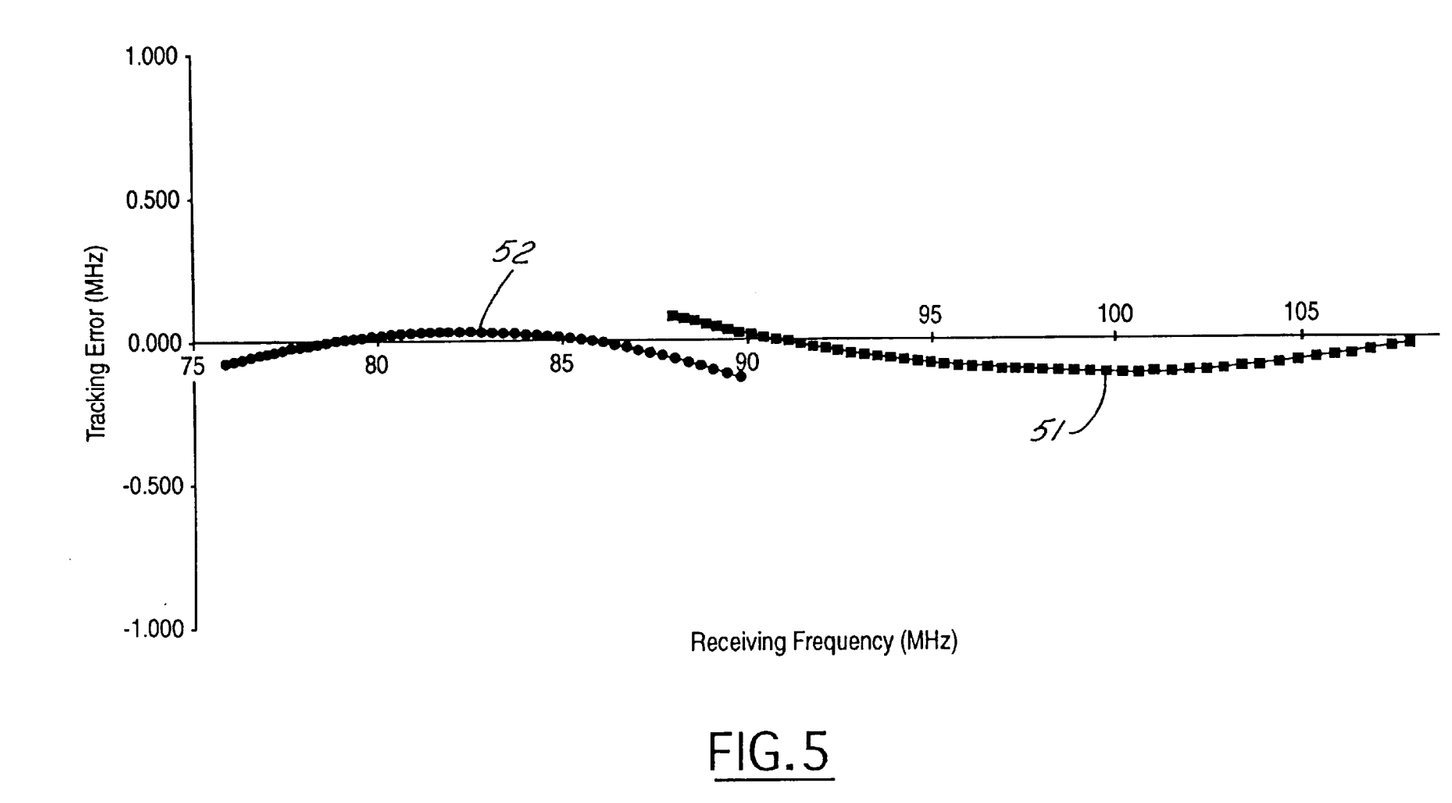
FIG. 5 is a characteristic diagram showing a tracking characteristic of the FM radio receiver of the present invention.

FIG. 5 is a characteristic diagram showing a tracking characteristic of the FM radio receiver of the present invention. The horizontal axis indicates reception frequency and the vertical axis indicates tracking error.

In case of a receiver configured for shipment to the US, the FM radio receiver is set to upper heterodyne as shown by 51. In case of a receiver configured for shipment to Japan, it is set to lower heterodyne as shown by 52.

While preferred embodiments of the FM radio receiver of the present invention have been described above, this invention is not limited to these embodiments. For example, instead of using a common tuning control voltage source, this invention can also be effective when the tuning control voltage supplied to the radio frequency tuning circuit is derived through a D/A converter circuit where a precisely corrected tuning control voltage is produced based on digital data stored in a memory device.

What is claimed is:

1. An FM radio receiver comprising:

a radio frequency tuning circuit for selecting a frequency modulated signal from an antenna; and a local oscillator tuning circuit for tuning to an oscillating signal so as to convert said frequency modulated signal to an intermediate frequency;

wherein said radio frequency tuning circuit and said local oscillator tuning circuit each have variable capacitance diode elements;

wherein said variable capacitance diode elements of said radio frequency tuning circuit and said variable capacitance diode elements of said local oscillator tuning circuit are connected to a tuning control voltage source;

wherein said radio frequency tuning circuit has a capacitance variable ratio set so as to be capable of receiving continuously a first receiving band and a second receiving band; and wherein said local oscillator tuning circuit is so constructed that an inductance value and a capacitance variable ratio can be switched according to a selected one of said first or second receiving band, so that said local oscillator tuning circuit is set to lower heterodyne when said first receiving band is selected or to upper heterodyne when said second receiving band is selected.

2. An FM radio receiver according to claim 1 wherein said first receiving band covers the frequencies of the FM radio broadcasting band in Japan and said second receiving band covers the frequencies of the FM radio broadcasting band in the United States.

3. An FM radio receiver comprising:

a radio frequency tuning circuit for selecting a frequency modulated signal from an antenna; and a local oscillator tuning circuit for tuning to an oscillating signal so as to convert said frequency modulated signal to an intermediate frequency;

wherein said radio frequency tuning circuit includes tuning coils and variable capacitance diodes connected to said tuning coils;

wherein said local oscillator tuning circuit includes an oscillator coil having a tap and a variable capacitance diode connected to a first terminal of said oscillator coil while a second terminal and a third terminal of said oscillator coil are grounded through inductance switching means to form an inductance value switching circuit, said local oscillator tuning circuit further including a capacitance variable ratio switching circuit comprising a capacitance element and capacitance switching means connected to said variable capacitance diode;

wherein a variable capacitance diode of said radio frequency tuning circuit and a variable capacitance diode of said local oscillator tuning circuit are connected to a tuning control voltage source; and wherein said inductance switching means and said capacitance switching means are switched according to selection of either a first or second receiving band, wherein lower heterodyne is selected for said first receiving band and upper heterodyne is selected for said second receiving band.

4. An FM radio receiver according to claim 3 wherein said capacitance variable ratio switching circuit is comprised of a first capacitance element connected in parallel with a series circuit of a second capacitance element and said capacitance switching means.

5. An FM radio receiver according to claim 3 wherein said capacitance variable ratio switching circuit is comprised of a first capacitance element and a second capacitance element connected in series and said capacitance switching means connected in parallel to one of said first capacitance element or said second capacitance element.

6. An FM radio receiver according to claim 3 wherein said first receiving band covers the frequencies of the FM radio broadcasting band in Japan and said second receiving band covers the frequencies of the FM radio broadcasting band in the United States.

7. An FM radio receiver comprising:
a radio frequency tuning circuit for selecting a frequency modulated signal from an antenna; and
a local oscillator tuning circuit for tuning to an oscillator signal so as to convert said frequency modulated signal to an intermediate frequency;
wherein said radio frequency tuning circuit includes tuning coils and variable capacitance diode elements connected to said tuning coils;
wherein said local oscillator tuning circuit includes an oscillator transformer in which a first coil and a second coil are connected in series and one of said variable capacitance diode elements is connected to a first terminal of said oscillator transformer, wherein second and third terminals of said oscillator transformer are grounded through respective inductance switching means to form an inductance value switching circuit, and wherein said local oscillator tuning circuit further includes a capacitance variable ratio switching circuit having a capacitance element and a capacitance switching means connected to said variable capacitance diode element;
wherein a variable capacitance diode element of said radio frequency tuning circuit and a variable capacitance diode element of said local oscillator tuning circuit are connected to a tuning control voltage source; and
wherein said inductance switching means and said capacitance switching means of the capacitance variable ratio switching circuit are switched according to selection of either a first receiving band or a second receiving band, wherein lower heterodyne is selected for said first receiving band and upper heterodyne is selected for said second receiving band.

8. An FM radio receiver according to claim 7 wherein said capacitance variable ratio switching circuit is comprised of a first capacitance element in parallel with a second capacitance element and said capacitance switching means connected in series.

9. An FM radio receiver according to claim 7 wherein said capacitance variable ratio switching circuit is comprised of a first capacitance element and a second capacitance element connected in series, said capacitance switching means being connected in parallel with one of said first capacitance element or said second capacitance element.

10. An FM radio receiver according to claim 7 wherein said first receiving band covers the frequencies of the FM radio broadcasting band in Japan and said second receiving band covers the frequencies of the FM radio broadcasting band in the United States.

11. An FM radio receiver comprising:
a radio frequency tuning circuit for selecting a frequency modulated signal from an antenna; and
a local oscillator tuning circuit for tuning to an oscillator signal so as to convert said frequency modulated signal to an intermediate frequency;
wherein said radio frequency tuning circuit includes tuning coils and variable capacitance diode elements connected to said tuning coils;
wherein said local oscillator tuning circuit includes two oscillator coils connected in series and variable capacitance diode elements connected to said oscillator coils, wherein an inductance value switching circuit is comprised of said two oscillator coils and an inductance switching means selectively grounding a common junction of said two oscillator coils, and wherein a capacitance variable ratio switching circuit is comprised of capacitance elements and a capacitance switching means connected to said variable capacitance diode elements;
wherein a variable capacitance diode element of said radio frequency tuning circuit and a variable capacitance diode element of said local oscillator tuning circuit are connected to a tuning control voltage source; and
wherein said inductance switching means and said capacitance switching means are switched according to a selected one of a first or second receiving band, so that said local oscillator tuning circuit is set to lower heterodyne when said first receiving band is selected or to upper heterodyne when said second receiving band is selected.

12. An FM radio receiver according to claim 11 wherein said capacitance variable ratio switching circuit is comprised of a first capacitance element connected in parallel to a series combination of a second capacitance element and said capacitance switching means.

13. An FM radio receiver according to claim 11 wherein said capacitance variable ratio switching circuit is comprised of a first capacitance element and a second capacitance element connected in series, said capacitance switching means being connected in parallel with one of said first capacitance element or said second capacitance element.

14. An FM radio receiver according to claim 11 wherein said first receiving band covers the frequencies of the FM radio broadcasting band in Japan and said second receiving band covers the frequencies of the FM radio broadcasting band in the United States.

15. An FM radio receiver comprising:
a radio frequency tuning circuit for selecting a frequency modulated signal from an antenna; and
a local oscillator tuning circuit for tuning to an oscillator signal so as to convert said frequency modulated signal to an intermediate frequency;
wherein said radio frequency tuning circuit includes tuning coils and variable capacitance diode elements connected to said tuning coils;
wherein said local oscillator tuning circuit includes two oscillator coils connected in series between ground and one of said variable capacitance diode elements, wherein an inductance value switching circuit is comprised of said two oscillator coils and an inductance switching means for grounding a common junction of said two oscillator coils, and wherein a capacitance variable ratio switching circuit is comprised of capacitance elements and a capacitance switching means connected to said variable capacitance diode elements;

wherein a variable capacitance diode element of said radio frequency tuning circuit and a variable capacitance diode element of said local oscillator tuning circuit are connected to a tuning control voltage source; and wherein said inductance switching means and said capacitance switching means are switched according to selection of either a first or second receiving band, wherein lower heterodyne is selected for said first receiving band and upper heterodyne is selected for said second receiving band.

16. An FM radio receiver according to claim 15 wherein said capacitance variable ratio switching circuit is comprised of a first capacitance element connected in parallel with a series combination of a second capacitance element and said capacitance switching means.

17. An FM radio receiver according to claim 15 wherein said capacitance variable ratio switching circuit is comprised of a first capacitance element and a second capacitance element connected in series, said capacitance switching means being connected in parallel with one of said first capacitance element or said second capacitance element.

18. An FM radio receiver according to claim 15 wherein said first receiving band covers the frequencies of the FM radio broadcasting band in Japan and said second receiving band covers the frequencies of the FM radio broadcasting band in the United States.

* * * * *